United States Patent [19]

Stamp et al.

[11] Patent Number: 5,421,989
[45] Date of Patent: Jun. 6, 1995

[54] PROCESS FOR THE METALLIZATION OF NONCONDUCTIVE SUBSTRATES WITH ELIMINATION OF ELECTROLESS METALLIZATION

[75] Inventors: Lutz Stamp; Elisabeth Zettelmeyer-Decker; Norbert Tiemann, all of Berlin, Germany

[73] Assignee: Atotech Deutschland GmbH, Germany

[21] Appl. No.: 116,535

[22] Filed: Sep. 3, 1993

Related U.S. Application Data

[63] Continuation-in-part of Ser. No. 114,055, Aug. 31, 1993.

[51] Int. Cl.⁶ .............................................. C25D 5/54
[52] U.S. Cl. ................................. 205/166; 205/159; 205/160; 205/163; 205/188
[58] Field of Search ............... 205/159, 160, 161, 163, 205/166, 125

[56] References Cited

U.S. PATENT DOCUMENTS

| | | | |
|---|---|---|---|
| 2,702,253 | 2/1955 | Bergstrom | 117/47 |
| 3,011,920 | 12/1961 | Shipley, Jr. | 117/213 |
| 3,099,608 | 7/1963 | Radovsky | 204/15 |
| 3,984,290 | 10/1976 | Kitaev et al. | 204/24 |
| 4,631,117 | 12/1986 | Minten et al. | 204/15 |
| 4,634,468 | 1/1987 | Gulla et al. | 427/304 |
| 4,652,311 | 3/1987 | Gulla et al. | 106/1.11 |
| 4,683,036 | 7/1987 | Morrissey et al. | 205/125 |
| 4,725,314 | 2/1988 | Gulla et al. | 106/1.11 |
| 4,810,333 | 3/1989 | Gulla et al. | 204/15 |
| 4,891,069 | 1/1990 | Holtzman et al. | 106/1.15 |
| 4,895,739 | 1/1990 | Bladon | 427/304 |
| 4,969,979 | 11/1990 | Appelt et al. | 205/131 |
| 5,071,517 | 12/1991 | Oabayashi | 205/158 |
| 5,145,572 | 9/1992 | Hupe et al. | 205/219 |

FOREIGN PATENT DOCUMENTS 2123306 2/1984 United Kingdom.

OTHER PUBLICATIONS

Harnden, "A System For Direct Plating", North East Circuits Association Technical Conference, Mar. 19, 1992.

*Primary Examiner*—John Niebling
*Assistant Examiner*—Kishor Mayekar
*Attorney, Agent, or Firm*—Finnegan, Henderson, Farabow, Garrett & Dunner

[57] ABSTRACT

A process for applying a principal metal coating to a non-conductive substrate without employing an electroless coating is disclosed comprising:

(a) contacting the substrate with a suspension comprising a noble metal colloid suspended in a polymer matrix to obtain a coated substrate;

(b) optionally removing at least part or substantially all of the polymer matrix from said coated substrate;

(c) electrolytically coating the substrate obtained after step (a) or (b) with a solution of the principal metal coating. The polymer matrix is selected to combine with the metal of the noble metal coating or principal metal or both. Prior to contacting the substrate with the suspension, it may be contacted with a conditioner that will combine with the noble metal or principal metal or both to obtain a conditioned substrate. The conditioned substrate is then contacted with the suspension. A sufficient amount of the polymer matrix may be removed so that the residue of the polymer matrix will combine with the principal metal and the outer surface of the principal metal coating will be substantially free of the polymer matrix.

15 Claims, No Drawings

PROCESS FOR THE METALLIZATION OF NONCONDUCTIVE SUBSTRATES WITH ELIMINATION OF ELECTROLESS METALLIZATION

RELATED APPLICATIONS

The present application is a Continuation-in-part of U.S. patent application Ser. No. 08/114,055 filed Aug. 31, 1993.

BACKGROUND OF THE INVENTION

1. Field of the Invention

The field of the invention is the electrometallization of non-metallic substrates without using an electroless metal coating. In one embodiment, the invention relates to circuit boards and a method for improving the manufacture of such boards by eliminating electroless plating of the boards and effecting through-hole plating and/or directly forming circuits thereon by an electrolytically deposited metal coating. A novel coating process and composition are disclosed for this process.

2. Discussion of the Related Art

Many processes are known for the formation of metal coatings on non-metallic substrates either for decorative or functional purposes. One of the more commercially important uses of such coatings is in the manufacture of printed circuit boards. Printed circuit boards (PCB's) comprise, for example, a rigid non-conducting or dielectric base made up of a fibrous material such as glass fibers, paper and the like in combination with a polymer such as an epoxy resin, and a conductive metal layer such as copper on either one or both surfaces. Multilayer boards (MLB's) comprise several PCB's laminated to one another by means of an adhesive. In addition to rigid boards (as described above), flexible boards can be produced employing thermoplastic dielectric layers such as fluorocarbon polymers, Nylon polymers, polyimides, Kevlar TM reinforced polymers, polyparabanic acids and polyesters. Flexible boards are manufactured without fiber reinforcing. Production of both of these types of printed circuit boards are described in *Printed Circuits Handbook*, Second Edition, edited by C. F. Coombs, Jr., McGraw-Hill, 1979, which is incorporated herein by reference. Laminated combinations of flexible and rigid boards are also finding utility in some applications for MLB's.

In the manufacture of PCB's, a metal conductive foil such as copper is bonded to the circuit board, although any metal may be applied to a non-conductive dielectric circuit board as a foil or by electrodeposition or electroless deposition.

Prior to laminating PCB's to form an MLB, the metal surface is treated in an art known manner to produce electrically conductive lines (circuits) for the transfer of current between components of an electric circuit, the components comprising by way of example diodes, transistors, resistors, capacitors and the like. The circuits may be formed either by a positive or a negative working photoresist, silk screen resist or hand painted resist process followed by etching and in some instances, electrodeposition of a metal or metals, all of which is known in the art.

In forming MLB's by laminating, an adhesive in the form of a prepreg is inserted between the surfaces of the PCB's that are to be laminated, after which the multilayers are further treated by application of heat and pressure. The prepreg generally comprises a woven or non-woven layer or layers of fibers such as glass, cellulose (e.g., paper), and the like, glass being preferred. The prepreg also is impregnated with a so-called "B-stage" resin such as an epoxy resin that has been partially cured. Art known equivalents of epoxy resins are also employed as adhesives such as acrylic resins (used with polyimide circuit boards) or polyester resins.

In MLB's, the circuit of one board is connected to the circuit of one or more of the other boards in the multilayers. This is done by forming pads or circular areas of metal at a point or points on the conductive line or lines of the board. The pads may also be isolated from the conductive lines. The other board or boards that are to be connected are similarly provided with pads and in the laminating process the pads of the different boards are aligned over one another.

The MLB is then pressed and cured after which the pads of the MLB's are drilled to form through-holes. These holes can penetrate the board completely or partially, the latter sometimes referred to as "dead-end" holes. The diameter of the drill is considerably less than the diameter of the pad, the ratio of diameters of the pad to the drill being about 2:1 or greater, so that the overall structure comprises at a minimum, a pad from one board aligned over a pad from another board, with a through-hole passing through them. Since the through-hole in cross-section ideally presents a surface of alternating layers of the pads of the individual PCB's separated by the non-conductive base, an electrically conductive element has to be employed in the hole to form an electrical connection between the pads. This is done by a process known in the art as through-hole plating (PTH).

PTH processes are also employed for connecting two metal conductive surfaces having a single non-conductive or dielectric board interposed therebetween for the formation of a PCB. Boards of this type and the formation of through-holes in such boards are to be considered as falling within the scope of the present invention and are intended to be included within the broad definition of an MLB as that term is used throughout the written description of the present specification.

Before the PTH process can be undertaken, any "smear" in the hole must be removed. Smearing is encountered when the drill bit employed to form the hole through the aligned pads in an MLB picks up resinous material from the hole and deposits this material on the wall of the hole during the drilling process. Since the wall of the hole contains alternating resinous material layers and metal layers, the surface of the metal layers that form part of the hole wall will be coated with the resinous material thereby preventing any metallic plating material applied to the surface of the hole wall from contacting the metal layers and forming an electrically conductive connection with it. It is believed that the resinous material such as a B-stage epoxy resin used in the prepreg comprises the principle material involved in the smearing of the hole. Smearing, therefore, renders the PTH process ineffective.

The problem of smearing is overcome by chemical cleaning in which a strong mineral acid such as sulfuric acid is used in an "etch-back" process to etch away the "smear" from the wall of the hole. Hydrofluoric acid may be added to the sulfuric acid to remove any glass fiber ends that might be projecting into the hole. The glass fiber ends come from the glass fiber employed in the manufacture of the circuit boards or prepreg and are removed since they cause imperfections in the surface of the metallic coating applied by the PTH process and can cause conductivity failures in the hole.

Other desmearing processes can be employed which are known in the art in which, chromic acid or preferably a permanganate is used. Additionally, desmearing with a plasma can also be employed.

The etch-back process requires very careful control in order to prevent excessive etching of the wall of the hole. The concentration and temperature of the etching solution has to be monitored as well as the length of time over which the etching process is conducted.

After smear is removed, the through-hole is plated. Prior art methods comprise the application of electroless copper as a PTH plating material. Standard electroless copper plating solutions known in the art are used for this purpose. Prior to applying the electroless copper, and in order to promote its deposition on the non-conductive surface, the non-conductive surface is treated with a two step activation process comprising the application of a stannous chloride sensitizer solution to the board followed by a sensitizer solution of divalent palladium chloride according to the process of Bergstrom et al., U.S. Pat. No. 2,702,253. The stannous chloride is oxidized to stannic chloride and the palladium chloride reduced to palladium metal on the uncoated portions of the board. The palladium, however, when in contact with the copper cladding of the circuit board, forms a palladium immersion coating on the copper since palladium is more noble than copper and displaces it. This can result in an inordinate consumption of palladium in the process.

A preferred method for preparing the activator is described by Shipley, Jr., U.S. Pat. No. 3,011,920 which employs an activator comprising a noble metal suspension e.g., a colloidal palladium suspension, containing stannic and/or stannous tin which forms a protective colloid around the metallic palladium. The suspension implants a precious metal site on the non-conductive surface for the purpose of initiating the deposition of the copper by chemical reduction. This process substantially eliminates the problems of forming immersion palladium coatings on the copper surface of the copper-clad boards. A post activator is then employed, generally an acid, to solubilize the protective colloid and expose the noble metal, i.e., palladium.

It is generally believed that in these systems tin (II) hydroxide functions as a protective colloid to impart stability to the palladium suspension. The species absorbed on the nonconductive surface comprises palladium particles which are embedded in the bulky tin hydroxide, which leads to a rather low concentration of palladium absorbed on the surface. In the subsequent accelerator or activator step, the tin hydroxide is removed. The palladium is also desorbed with the removal of the bulky protective colloid and as a consequence, a surface is obtained with a rather low concentration of palladium and consequently relatively low surface conductivity.

The subsequently applied electroless copper coating solution contains cupric ions and a reducing agent such as formaldehyde, which reduces the cupric ions in the solution to copper metal. Palladium acts as a catalyst for the reduction. The copper metal plates out on the surface of the through-hole, making electrical contact with the walls of the metal pads through which the hole is drilled as well as the copper surface on the outer layer(s) of the MLB. The electroless copper may have subsequent metal coatings applied to it by electrolytic means.

The stability and plating characteristics of electroless copper are controlled to a large degree by additives known collectively as stabilizers or rate controllers. Because these additives require a fine balance in the plating bath under various production conditions, the electroless copper process is difficult to control precisely so that consistent results are obtained. This balance is obtained by conducting regular analyses of the components of the electroless bath as well as continuous or periodic addition of the various additives. Temperature control of the bath is also required as well as continuous filtration and aeration. The plating tank and bath filter have to be cleaned regularly and regular plating rate determinations have to be made as well.

Significantly, environmental problems have to be addressed when employing electroless copper, such as removal of the complexing agents employed in the bath from waste-water streams, removal of the metal from the bath prior to disposal of the spent bath, monitoring COD levels in waste-water, reducing such levels and lastly, exposure of operators and the environment to formaldehyde which is a carcinogen. The latter is an especially significant problem.

Various processes and compositions have been developed to avoid the use of electroless copper plating for many of the above reasons. Elimination of the electroless copper coating could also amount to significant cost savings in the production of metallized non-conductive materials such as circuit boards.

One of the systems used to avoid electroless coatings was based on conductive ink technology which relies on the physical deposition of a fine layer of carbon in the through-holes and over the entire board surface. This process is generally described by Minten et al., U.S. Pat. No. 4,631,117.

However, carbon deposits on the metal surface of a circuit board interfere with the adhesion of copper or other metals that are subsequently electroplated onto the base copper and accordingly, the carbon had to be removed by an etching step prior to electroplating. It was difficult to control this etching step and the carbon in the through-holes also had to be protected. The carbon coating was also subject to cracking when the MLB was exposed to thermal or mechanical stress. For these reasons, the carbon process had only limited commercial acceptance.

Another solution to the problem was the employment of conductive polymers, whereby the circuit board or other non-metallic substrate is immersed in a strong hot permanganate solution to produce manganese dioxide on the substrate, such as the epoxy surfaces of a MLB. When the board thus treated is contacted with a suitable monomer, the conductive polymer is formed on those areas on which the manganese dioxide is formed. One of the advantages of employing this process is there is little conductive polymer deposited on the copper surface of the circuit board. Some difficulties are presented, however, in that glass or other resins such as polyamides and polytetrafluoroethylene are not readily coated by this process. In addition, there are problems encountered in controlling polymer layer thicknesses and monomer instability, as well as some environmental problems. The monomers are generally hazardous substances and, because of their volatility, will escape into the atmosphere and polymerize to form a black film on other areas of the circuit board and the coating equipment.

Radovsky et al., U.S. Pat. No. 3,099,608, assigned to IBM, disclosed a process in the early 1960's for the direct metallization of non-conductive non-metallic substrates by a system using a "conductivator" metal such as palladium in colloidal or semi-colloidal form. By very carefully controlling the process, Radovsky et al. found that it was possible to build enough potential across the through-hole portion of a two-sided board to induce copper deposition. Although the process proved to be of little commercial value, several subsequent processes were based on the Radovsky et al. discovery.

Similar approaches were followed by Morrissey et al., British Patent 2,123,036, Passlick, German Patent 3,304,004, and Appelt et al., U.S. Pat. No. 4,969,979. The disadvantage of these systems is the high content of acid and chlorides in the palladium/tin catalyst. This results in an attack on the copper boundary layer between the copper and the non-conductor and the circuit boards processed are susceptible to red-ring defect. In order to maintain defect-free contact of the inner layers, the tin hydroxide must also be removed as completely as possible from the copper inner layers; however, a minimum quantity of tin must remain on the resin of the drilled holes since otherwise, a complete copper coating cannot be achieved with the subsequent electrodeposition. These conflicting requirements make it difficult to produce high quality circuit boards.

Holtzman et al., U.S. Pat. No. 4,891,069 discovered that if the palladium colloid was stabilized with a water soluble salt such as aluminum chloride, the palladium would act to combine with hydrogen that was generated electrolytically and this hydrogen could be employed to reduce a subsequently or simultaneously applied aqueous solution of a copper salt thereby eliminating electroless copper.

At about the same time, Morrissey et al., U.S. Pat. No. 4,683,036 developed the "EE-1" system in which the electroless coating process was also eliminated. In the EE-1 system, palladium "islands" are formed in the through-holes and plated by a special copper bath that contains an inhibitor which generally can be described as a surfactant, chelating agent, brightener or levelling agent.

Although the EE-1 process has some promise as a commercially viable method, it is not especially suitable in applications where panel plating is required while the panels are still wet from the catalyzing step. Additionally, the EE-1 process is not especially suitable for effectively plating high aspect ratio multilayer boards.

Several so-called sulfide conversion coatings can also be employed to electroplate non-conductive substrates without the application of an electroless metal coating such as those described by Bladon, U.S. Pat. Nos. 4,895,739 and 4,919,768, in which a catalytic metal chalcogenide is formed on a non-metallic substrate by applying a tin-noble metal electroless catalyst to the substrate and subsequently treating the substrate with a solution containing a dissolved sulfide to form a sulfide of the noble metal. An electrolytic metal coating is then applied to the substrate.

Gulla et al., U.S. Pat. No. 4,810,333 also describes the application of a transition metal sulfide to a non-metallic substrate adjacent to and in contact with conductive areas on the substrate after which electrolytic plating can be conducted over the sulfide formed. A permanganate solution is given as an example of one of the transition metal compounds that can be employed in the process and is used to form a manganese oxide coating on the substrate. This manganese coating is subsequently converted to a sulfide by means of a metal thiocarbamide solution.

The conductivity of the sulfide conversion coating, as well as the conductive polymers described previously is generally low. Accordingly, it is difficult to avoid what is known in the art as "dog-boning" as plating builds up near the through-hole entrances and in the case of small holes, closing the hole before plating has reached through the center of the hole. Long plating times are also encountered employing either one of these systems and this can contribute to excessive "pink-ring" formation.

Okabayashi, U.S. Pat. No. 5,071,517, assigned to Solution Technology Systems, describes a method for the direct electroplating of a non-conducting substrate where the substrate is first treated with a non-acidic aqueous salt solution containing a micro-fine colloidal suspension of a noble or precious metal and tin to form a strongly adsorbed, uniform conducting layer upon at least a portion of the substrate. The conducting layer is then electroplated directly. Okabayashi describes the use of an aldehyde such as lignin vanillin and notes that it is utilized to form the micro-fine palladium/tin catalyst. According to the invention, electroless plating systems, conversion coatings or preferential plating solution additives are avoided.

Harnden, in a paper presented at Northeast Circuits Association Technical Conference, Mar. 19, 1992, further describes the Solution Technology Systems catalyst as being easier to process control than electroless copper, noting that the uniformity and fineness of the catalysts are augmented by the use of a food grade aldehyde. Harnden goes on to state that with normal processing, the adsorbed catalyst does not provide enough conductivity to allow processing small holes or high aspect ratios, but by using a special alkaline accelerator, a continuous and highly conductive catalyst film is produced which is easily removed from the copper surfaces of a circuit board by micro-etching. It is further noted by the author that in order to achieve optimal conductivity after the boards are immersed in a warm solution of the tin-palladium colloid catalyst, they are immersed in a mild alkaline bath which also contains a small amount of copper ions which deposit on and between the tin-palladium particles.

Kitaev et al., U.S. Pat. No. 3,984,290 describes a PTH process in which a film is formed by immersing a MLB with through-holes into a solution containing ions of a metal which is more electropositive than the metal of the metal layers. The film obtained has a monolithic structure in the dielectric zones of the through-holes and a porous structure in the metal zones. Examples of solutions containing ions of a metal which is more electropositive than the metal of the MLB metal layers include silver salt/ammonium hydroxide solutions; palladium copper-salt/sulfuric acid solutions and palladium salt/hydrochloric acid solutions. Prior to immersion of the MLB into one of these solutions, the structure is preferably treated with a conventional sensitizer such as those containing ions of divalent tin or trivalent titanium.

SUMMARY OF THE INVENTION

Accordingly, an advantage of the present invention is that a process and composition are provided for the electrolytic plating of a non-metallic substrate without the application of an electroless coating to the substrate and substantially one or more of the limitations and disadvantages of the related art are obviated.

Another advantage of the invention is that it does not employ formaldehyde in the principal metal bath or coating composition and thereby avoids the various health and environmental problems associated with the use of formaldehyde.

The specific advantages and other advantages of the invention will be realized and attained by the process and composition of matter particularly pointed out in the written description and claims hereof.

To achieve these and other advantages and in accordance with the purpose of the invention, as embodied and broadly described herein, the invention comprises a process for applying a principal metal coating to a non-conductive substrate without an electroless coating comprising:

(a) contacting the substrate with a suspension and especially an aqueous suspension comprising a noble metal colloid suspended in a polymer matrix to obtain a coated substrate;

(b) optionally removing at least part or substantially all of the polymer matrix from the coated substrate.

(c) electrolytically coating the substrate obtained after step (a) or (b) with a solution of the principal metal coating.

The polymer matrix may be selected so that it or any residue of the polymer matrix on the substrate will combine with the metal of the principal metal coating or the noble metal or both by which it is meant that the polymer matrix or residue will adsorb or form a complex with the metal of the principal metal coating or noble metal coating or both.

In another embodiment, the substrate is contacted with a conditioner that will combine with the noble metal and in some cases the polymer matrix or the principal metal or both, to obtain a conditioned substrate. The conditioned substrate is then contacted with the suspension comprising the noble metal colloid suspended in a polymer matrix. Where the conditioner combines with the noble metal or principal metal it is intended that either the conditioner will adsorb or form a complex with the noble metal or principal metal or both.

The polymer matrix or residue of polymer matrix in some instances will improve the adhesion of the noble metal colloid particles to the substrate and increase the quantity of such particles that are adhered. In some cases the conditioner also has this kind of beneficial effect.

In another embodiment of the invention, part, or substantially all of the polymer matrix is removed from the coated substrate by a solution of a chalcogen that will not form chalcogenides of the noble metal or the principal metal. The chalcogens in this respect are the Group VIA non-metallic elements with the exception of oxygen and especially sulfur. Some polymer matrices are completely removed from the substrate, or at least no measurable residue is detected.

In another embodiment, a sufficient amount of the polymer matrix is removed so as to leave a residue of the polymer matrix on the substrate that will combine with the principal metal, and the outer surface of the principal metal coating will be substantially free of the polymer matrix. The residue may be a few monolayers of the polymer matrix.

After removing at least part or substantially all of the polymer matrix from the coating by the process of the present invention a larger quantity of noble metal colloid is left on the substrate as compared to a substrate catalyzed with a palladium/tin hydroxide protective colloid that has been treated with an acid accelerator to remove the tin hydroxide and expose the palladium colloid. The larger quantity of noble metal colloid and consequent increase in the contact of the particles of the noble metal colloid accounts, in some measure, for the improved conductivity of the coating as compared to substrates treated with a palladium/tin hydroxide system and acid accelerator.

The process and the composition of the invention are especially useful for metal coating and especially copper coating MLB's, forming circuits on MLB's and PTH processes.

It has been found that the process and the composition of the present invention when used in the production of MLB's selectively coat only the non-conductive surfaces with an electrically conductive layer and avoid some of the problems of Radovsky et al., and similar processes where in the PTH process the protective colloid (i.e., a tin hydroxide) of the palladium catalyst had to be removed as completely as possible from the copper inner layers while still retaining a minimum quantity of the tin on the resin of the drilled holes.

It is to be understood that both the foregoing general description and the following detailed description are exemplary and explanatory and are intended to provide further explanation of the invention as claimed.

DETAILED DESCRIPTION

The various non-conductive substrates such as the MLB structures previously described herein or any coated or uncoated circuit board may be treated according to the process of the present invention as well as other non-conductive substrates such as polymeric substrates, ceramic substrates or other metal oxide non-conductive substrates and also the substrates generally and specifically described by Lee in U.S. Pat. No. 3,748,109, which is incorporated herein by reference.

The substrate is contacted with a suspension comprising a noble metal colloid suspended in a polymer matrix to obtain a coated substrate.

The noble metal in this regard comprises the Group VIII noble metals, ruthenium, rhodium, palladium, osmium, iridium, and platinum, and the Group IB noble metals, silver and gold. The preferred Group VIII noble metals are rhodium, palladium, iridium and platinum, palladium being especially preferred as the noble metal.

The noble metal colloids are prepared in a conventional way by forming an aqueous solution of a salt of the noble metal and then combining the solution with a reducing agent in a manner well known in the art. The noble metal colloid is stabilized, i.e., used in combination with a polymer matrix preferably in an aqueous medium, the concentration of the noble metal being anywhere from about 50 mg/l to about 1,000 mg/l and especially from about 100 mg/l to about 500 mg/l. The economy of the process generally dictates the upper limit of the concentration. The polymer matrix comprises either an ionic or a nonionic soluble organic polymer and especially a water-soluble polymer. Natural polymers can be employed in this regard such as proteins, peptides, polysaccharides, gelatin, agar-agar, gum arabic, tannin, and synthetic polymers such as alkyl or hydroxyalkyl cellulose, polyvinylpyridine, polyvinyl alcohol, polyvinylacetate, polyethyleneglycol, polyimine, polyacrylic acid, polyacrylamide, polyacrylates, polyvinylpyrrolidone, polyvinylmethylketone, as well as copolymers and mixtures of these components. Polyvinylpyrrolidone is especially suitable. The molecular weight of the polymers can be from about 1,000 to 10,000,000, especially from about 2,000 to about 2,000,000, or about 3,000 to 100,000 as well as any range or value falling within these limits. The ratio by weight of the noble metal to polymer can be anywhere from about 3:1 to 1:100 and especially from about 1:1 to about 1:10.

The production of these colloids is further described by Gulla et al., U.S. Pat. Nos. 4,652,311, 4,634,468, and 4,725,314 and Hupe, U.S. Pat. No. 5,145,572, all of which are incorporated herein by reference.

The noble metal colloids are formed in a manner so that the particle size is anywhere from about 50Å to about 2,000Å, or from about 100Å to about 1,000Å and especially from about 200Å to about 500Å. The particle size distribution as monitored with an atomic force microcscope should be within a range to substantially avoid particles less than about 10 nm. Larger particle size colloids can be obtained by process steps well known in the art such as by employing relatively strong reducing agents to convert the noble metal salt into a colloid, adding the reducing agent to the metal salt slowly and conducting the reaction at a relatively high temperature. Additionally, the reduction reaction is conducted with agitation and where the agitation is not too vigorous, the formation of larger particle size colloids is favored.

The use of weak reducing agents such as ascorbic acid, formic acid and formaldehyde, lower temperatures, higher concentrations of reactants and vigorous agitation favor the formation of smaller particle size colloids, i.e., colloids about 500Å or less. A method for manufacturing the smaller particle size colloids, i.e., those having a particle diameter of less than about 500Å is described by Gulla et al., U.S. Pat. No. 4,634,468.

The reducing agents that may be employed either in forming the noble metal colloid or as described herein, to counteract any oxidation of the noble metal colloid after it has been formed, are also generally disclosed in U.S. Pat. No. 4,005,051 incorporated herein by reference and include, for example, lower alkylamine boranes such as dimethylamine borane, alkali metal borohydrides such as sodium, potassium, or lithium borohydride, and especially sodium borohydride, ascorbic acid, iso-ascorbic acid, sodium hypophospite, formic acid, formaldehyde, and hydrazine or hydrazine compounds such as hydrazinehydrate and hydrazine salts such as the sulphate, fluogermanate, fluosilicate, formate, dihydrochloride, monohydrochloride, hydroiodide, dinitrate, mononitrate, oxalate, hypophosphite, orthophosphate, orthophosphite, selenate picrate or tartarate of hydrazine. Other hydrazine derivatives may be employed such as benzyl hydrazine; 1,1-dimethylhydrazine; 1,2-dimethylhydrazine; 1,2-dimethylhydrazine dihydrochloride; ethylhydrazine; methylhydrazine; (2-nitrophenyl)hydrazine; phenylhydrazine hydrochloride; iso-propylhydrazine and hydrazo diformic acid.

Hydroxylamines may also be used as reducing agents including both $\alpha$- or $\beta$-hydroxylamines such as the $\alpha$- or $\beta$-lower alkyl hydroxylamines, (where lower alkyl, includes 1 to about 5 carbon atom alkyl including both the straight chain alkyl groups and isomers thereof) such as $\alpha$- or $\beta$-methylhydroxylamine; $\alpha$- or $\beta$-ethylhydroxylamine; or $\alpha$- or $\beta$-arylhydroxylamines where aryl is phenyl, benzyl or naphthyl and may be substituted by one or more lower alkyl groups and includes $\alpha$- or $\beta$-phenylhydroxylamine and the like.

It is advantageous both from the standpoint of costs and ease of handling if the solvent employed for the manufacture of the colloid is water; however, an organic solvent or mixtures thereof or mixtures of an organic solvent with water can also be employed for the manufacture of the colloid.

It is also preferred that the noble metal colloid contains a halogen ion and especially a chloride, bromide or iodide ion or any mixtures of halide ions in an amount from about 0.1 to 50 g/l since this facilitates the subsequent electrodeposition of the principal metal on the nonconductive substrate, especially in the PTH process for MLB's. It has been found that by incorporating a halide ion into the suspension, a uniform metal coating is obtained even after significantly shorter electrodeposition times.

The pH of the suspension also has an affect on the electroplatability of the non-metallic substrate treated with the suspension. It is preferred that the pH values are in the acidic range and especially from about 1 to about 3 and preferably from about 1.5 to about 2, especially where the polymer matrix comprises a polyvinylpyrrolidone.

When the noble metal colloid suspension is used at acidic pH values, the result obtained, (particularly with the less noble of the noble metals such as silver, palladium and ruthenium), is a slower oxidation and redissolution of the metal by atmospheric oxygen or carryover oxidizing agents.

The noble metal colloid in the suspension may also be contacted with a reducing agent to counteract any oxidation of the noble metal colloid. In one embodiment, the nonmetallic substrate such as the circuit board is contacted with a diluted solution of a reducing agent prior to contacting the substrate with the noble metal colloid. The reducing agent can also be applied to the substrate after it has been conditioned, conditioning of the substrate being described subsequently herein. Small quantities of reducing agents can also be added to the noble metal colloid suspension and in some instances both methods may be employed, i.e., contacting the substrate with the reducing agent and adding it to the suspension as well. A preferred method comprises continuously monitoring the reduction potential in the metal colloid solution by means of an electrode and keeping the reduction potential at a constant value by automatic replenishment of the reducing agent. This procedure has proved to be particularly advantageous even with reducing agents (such as borane, hypophosphite) which are catalytically decomposed by the noble metal colloid. In this case, the hydrogen generated during decomposition takes over the buffering against oxidizing agents. Smaller particle size noble metal colloids (with the exception of gold) tend to oxidize faster and accordingly larger particle size, e.g., from about 500Å to about 1000Å are preferred.

For optimum conductivity, the suspension of the noble metal colloid is maintained under reducing conditions. An electrochemical potential of the suspension of from about $-170$ Mv to about $-300$ Mv vs. Ag/AgCl is generally sufficient. Particle size distribution that substantially excludes particles less than about 10 nm is preferred in that the smaller particles are more susceptible to oxidation that lowers the conductivity of the particles.

As noted before, it is especially useful prior to contacting the substrate with the suspension of the noble metal colloid to contact the substrate with a conditioner that will combine with the noble metal.

This conditioner preferably comprises a chelate complexing agent and/or a cationic surface-active substance.

A useful class of positively charged polymers that function as cationic surface-active substances in the process of the invention are the emulsion copolymers disclosed in U.S. Pat. No. 4,359,537, incorporated herein by reference. These copolymers are formed from a major amount of a monoethylenically unsaturated monomer or mixture of monomers and a minor amount of a polyethylenically unsaturated monomer or mixtures of monomers which act to cross-link the polymer. Examples of monoethylenically unsaturated monomers include polycyclic aromatic compounds such as styrene, substituted styrenes including ethylvinylbenzene, vinyltoluene and vinylbenzyl chloride; and acrylic monomers such as the esters of methacrylic and acrylic acid including methyl acrylate, ethyl acrylate, propyl acrylate. Lower aliphatic esters of acrylic acid are preferred. Suitable polyunsaturated cross linking monomers include divinylbenzene, divinylpyridine, divinyltoluenes, ethylene glycol dimethacrylate, etc. Additional examples of each class of these materials may be found in the above referenced patent together with methods of emulsion polymerization.

The emulsion copolymers described above may be converted to positively charged ion exchange resins by methods known to the art and described in the aforementioned patent. For example, the cross linked styrene emulsion polymer may be chloromethylated with chloromethyl methyl ether in the presence of a Lewis acid such as aluminum chloride and the resulting intermediate emulsion copolymer may then be treated with a tertiary amine such as trimethylamine to form a quaternary amine chloride functional group. Alternatively, a strongly basic quaternary amine resin may be prepared by treating a cross linked acrylic ester emulsion copolymer with a diamine containing both a tertiary amine group and a primary or secondary amine group, such as dimethylaminopropylamine or di(3-dimethylaminopropyl) amine and quaternizing the resulting weakly basic resin with an alkyl halide such as methyl chloride annion.

Certain non-cross linked polymers are also suitable for use as conditioners in accordance with this invention. These non-cross linked polymers are soluble in water and form stable, aqueous solutions. Particularly useful materials include dimethylaminoethyl methacrylate polymer, quaternized with epichlorohydrin or ethylene oxide, poly N,N-dimethyl-3,5-methylene piperidinium salt, polyethylene amine, polymers of dimethyl diallyl-ammonium salt, where the salt counterion can be any soluble anion such as chloride ion; copolymers of dimethyl amine or monoethyl amine and epichlorohydrin, and quaternized forms of the above copolymers, and modified natural organic polyelectrolytes such as guar gum treated with diethylaminoethyl-chloride hydrochloride.

The cationic surface active agents that may be employed in this respect comprise:
(a) quaternary ammonium compounds including;
(i) cationic quaternary ammonium salts based on fatty amines,
(ii) amphoteric quaternary ammonium salts based on fatty amines.

The cationic surface active agents that are employed in this respect may be cationic quaternary ammonium salts based on fatty amines such as:
(a) 1-propanaminium,N-(2-hydroxyethyl)N-N-dimethyl-3-[(1-oxooctadecyl) amino]-salts;
(b) 1-propanaminium,N,N,N-trimethyl-3-[(1-oxododecyl)amino]-alkyl ester salts;
(c) 1-propanaminium,(3-dodecyloxy)-2-hydroxy-N,N-bis(2-hydroxyethyl)-N-methyl-alkyl ester salts.

The foregoing compounds may be prepared either as the phosphate salts, nitrate salts, methylsulfate salts and the like and are further identified as C.A. Reg. Nos. 3758-54-1; 2764-13-8; 1-595-49-0 and 18602-17-0. Although for the purpose of this invention, these compounds are defined as salts, this definition is intended to be broad enough to include the inorganic esters such as the lower alkyl esters e.g. methyl sulfate as well as the organic salts e.g. phosphates, nitrates, sulfates and the like.

Aliphatic amine ethoxylates of the formula:

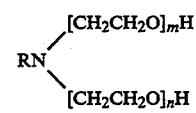

may also be employed as cationic quaternary ammonium salts based on fatty amines, as one of the groups of conditioners employed in the conditioner composition of the present invention, wherein the aliphatic group R is derived from coco, soybean, tallow, stearyl or oleyl fatty acids. The value of m+n is anywhere from about 2 to about 15.

Additionally, alkylbenzyldimethylammoniumchlorides may be employed where the alkyl group is derived from a fatty acid and especially comprises a behenyl group.

The chelate complexing agent may comprise any of the various classes of chelating agents and specific compounds disclosed in Kirk-Othmer, Encyclopedia of Chemical Technology, Third Edition, Volume 5, pages 339–368, incorporated herein by reference. These may comprise the aminocarboxylic acids and the hydroxycarboxylic acids. Some specific aminocarboxylic acids that may be employed in this respect comprise ethylenediaminetetraacetic acid, hydroxyethylethylenediaminetriacetic acid, nitrilotriacetic acid, hydroxyethylethylene-diaminetriacetic acid, nitrlotriacetic acid, N-dihydroxy-ethylglycine, and ethylenebis(hydroxyphenylglcine). Tetra (lower alkyl) ammonium hydroxy compounds may also be employed where the lower alkyl has from about 2 to about 6 carbon atoms such as tetrabutyl ammonium hydroxide. Hydroxycarboxylic acids that may be employed comprise tartaric acid, citric acid, gluconic acid and 5-sulfosalicylic acid. Amino carboxylic acids may be used as chelating agents and include lysine, alanine, valine, leucine, isoleucine, proline, phenylalanine, tryptophan, methionine, glycine, serine, threonine, cystenine, tyrosine, asparagine, glutamine, aspartic acid, glutamic acid, arginine, histidine and the like and the so called rare amino acids e.g. gamma-amino butyric acid, gamma-methyleneglutamic acid, 5-hydroxylysine and the like. Mixtures of chelating agents may also be used e.g. two or three or four component mixtures.

The preferred conditioners comprise nitrogen-containing compounds capable of combining with the noble metal.

The conditioners that are especially preferred comprise cationic wetting agents such as trimethyl lower alkylammoniumhalogenides, cationic polyelectrolytes such as the aforementioned quaternized polymers and especially quaternized polyvinylimidazole or nitrogen-containing chelate complexing agents such as the lower alkanolamines. The lower alkyl groups in this respect comprise those alkyl groups having one to about 5 carbon atoms including the straight chain and the various branched chain isomers thereof. Lower alkanolamines that may be employed in this regard comprise:
diethanolamine;
triethanolamine;
monoisopropanolamine;
diisopropanolamaine;
triisopropanolamine;
mono-sec-butanolamine;
di-sec-butanolamine;
2-amino-2-methyl-1-propanediol;
2-amino-2-ethyl-1,3-propanediol;
2-dimethylamino-2-methyl-1-propanol;
tris(hydroxymethyl) aminomethane; and various mixtures of the alkanolamines.

The chalcogen compounds which are employed to remove the polymer matrix from the coated substrate preferably comprise those diluted solutions of compounds which contain the chalcogen in an oxidation state (Ox) of from $0 < Ox < 6$. Examples of sulfur compounds which can be used in this respect comprise sulfonic acids, sulfinic acids, sulfoxides, sulfones, sulfites, dithionites, dithionates, thiosulfates or tetrathionates. Sulfinic acids are especially preferred in this regard such as hydroxyalkane sulfinic acids where the alkane group contains from one to about 5 carbon atoms including both the straight chain alkanes and isomers thereof and include hydroxymethane sulfinic acid and the like. The selenium and tellurium analogs of these sulfur compounds may be employed as well as any mixture of the chalcogenide compounds.

In one embodiment it has been demonstrated that a solution of thiosulfate and citrate substantially removes the polymer matrix (e.g., polyvinylpyrrolidone) from the novel metal colloid so that the polymer matrix will not substantially be readsorbed onto any copper subsequently applied or onto the noble metal colloid. ESCA surface analysis shows that there are still traces of polymer matrix in the copper and noble metal colloid after treatment with this solution. These traces of the polymer matrix can combine with i.e., absorb or complex copper ions or other principal metal ions thus improving the plating characteristics of the principal metal. The conductivity of the noble metal does not by itself account for improved plating characteristics. These improved plating characteristics include better initial current density, better glass fiber coverage and better metal distribution in the glass fiber coverage in the through hole in PTH processes.

Substrates thus treated can then be electrolytically coated by conventional methods with a principal metal coating where the metal is either a group IB, IIB, IIIA, IVA, VB, VIB, VIIB or VIII metal, especially the group IB, IIB, IVA and group VIII metals, and especially copper, silver, gold, zinc, cadmium, cobalt, nickel, tin, lead and the noble group VIII metals, and various combinations thereof to form alloys, but especially copper and copper alloys. Multiple layers e.g., 2 to about 5 layers of the foregoing metals and alloys may be provided where the layers are the same or different metals or alloys.

Applying copper coatings from matte copper baths is especially advantageous and is well known in the art The following examples are illustrative.

Example 1: Production of the colloid.

Solution a: 1.7 g $PdCl_2$ is dissolved in 40 ml (10–200 ml) of 20% hydrochloric acid, with slight heating and diluted to 1 liter with water. This solution is brought up to 3 liters with water and combined with polyvinyl pyrollidone K15 (PVP K15), so that the concentration of the PVP K15 is about 0.75 wt. %.

Solution b: 10 g (5–100 g/l) $NaH_2PO_2.H_2O$ is dissolved in 1 l of water.

Solution b is added to solution a under intensive stirring. After a short time, the resultant solution begins to darken and total development begins. The reaction ends when the release of gas has stopped. After the adjustment of the pH with hydrochloric acid or sodium hydroxide to 1.8 (0.8–3.5), the solution is ready to use.

No settling of palladium particles is observed even after long storage times and at high temperatures.

If the solution comes into intensive contact with air for a relatively long period of time, the palladium may redissolve. In this case, the colloid suspension can be regenerated by addition of 2 g/l sodium hypophosphite.

Example 2

Example 1 is repeated but in place of the polyvinylpyrrolidone K15, polyvinylpyrrolidone K60 is used. Likewise a colloid suspension with outstanding stability is obtained, with which good drilled hole metallization can be achieved.

Example 3: Process cycle with Smear Removal

| | Process step | Content | T | Process Time |
|---|---|---|---|---|
| 1. | Sources | | 65° C. | 5 min |
| | Source Securiganth P | 500 ml/l | | |
| | pH correction sol. CC* | 23 ml/l | | |
| 1.a | Rinsing | | | |
| 2. | Potassium permanganate etching | | 65° C. | 10 min |
| | Potassium permanganate | 60 g/l | | |
| | Potassium manganate | 20 g/l | | |
| | Sodium hydroxide | 40 g/l | | |
| 2.a | Rinsing | | | |
| 3. | Cleaning/conditioning | | RT | 5 min |
| | Reducing cleaner Securiganth P* | 100 ml/l | | |
| | Hydrogen peroxide (30%) | 15 ml/l | | |
| 3.a | Rinsing | | | |
| 4. | Etch cleaning | | RT | 2 min |
| | Etch cleaner Securiganth C* | 40 g/l | | |
| | Sulfuric acid (d = 1.84) | 10 ml/l | | |
| | Wetting agent G13* | 2 ml/l | | |
| 4.a | Rinsing | | | |
| 5. | Predipping | | RT | 1 min |
| | Sodium hypophosphite | 1 g/l | | |
| 6. | Coating with noble metal colloid | | 75° C. | 10 min |
| 6.a | Rinsing | | | |
| 7. | Postdipping | | RT | 2 min |
| | Hydroxymethane sulfinic acid | 2 g/l | | |

-continued

| Process step | Content | T | Process Time |
|---|---|---|---|
| 7.a Rinsing | | | |
| 8. Pickling | | RT | 1 min. |
| Sulfuric acid | 50 ml/l | | |
| (d = 1.84) | | | |
| 9. Electrodep. copper . . . | | RT | |
| Cupracid BL-CT | | | |

Double-sided, multilayer circuit boards made of epoxy resin with paper or glass fiber reinforcement, polyimide, or Teflon with pass-through contacts according to this example are of outstanding quality and present neither defects in the coating of the various materials with copper nor in the contact of inner layers.

Example 4: Process corresponding to Example 3 without steps 7 and 7a.

Circuit boards processed in this manner are likewise of high quality. However, if the electrodeposition is meticulously performed, it must be noted that a complete coating of the drilled hole walls with copper takes longer than in Example 3.

Example 5: Process cycle without Smear Removal

| Process step | Content | T | Process Time |
|---|---|---|---|
| 1. Etch cleaning | | RT | 2 min |
| Etch cleaner Securignath* | 200 g/l | | |
| H$_2$SO$_4$ (d = 1.84) | 10 ml/l | | |
| Wetting agent G13* | 2 ml/l | | |
| 1.a. Rinsing | | | |
| 2. Conditioning | | 60° C. | 5 min |
| Triethanolamine | 10 g/l | | |
| 2.a Rinsing | | | |
| 3. Predipping | | RT | 1 min |
| Sodium hypophosphite | 3 g/l | | |
| 3.a Rinsing | | | |
| 4. Coating with noble metal colloid (see Ex. 1) | | 65° C. | 10 min |
| 4.a Rinsing | | | |
| 5. Postdipping | | RT | 2 min |
| Hydroxymethane sulfinic acid | 5 g/l | | |
| 6. Pickling | | RT | 1 min |
| Sulfuric acid (d = 1.84) | 50 ml/l | | |
| 7. Electrodep. copper . . . | | RT | 10 min |
| Cupracid BL-CT | | | |

Flexible, rigiflex, or rigid double-sided, multilayer circuit boards made of epoxy resin with paper and/or glass fiber reinforcement, polyimide, thermoplastics, or ceramic treated according to this example are through-contacted without problems. During and after treatment with the postdipping solution, no tarnishing of the copper cladding is observed; instead, the copper surfaces are bright pink.

Example 6

The process corresponding to Example 5 is repeated with a conditioner of 5 g/l sodium carbonate and 5 g/l Basotronic PVI (product of BASF AC, Ludwigshafen).

Circuit boards treated according to this process present the same good results as those treated according to Example 3 through 5.

Example 7

The process corresponding to Example 5 and 6 is repeated with a postdipping solution of 10 g/l sodium thiosulfate instead of hydroxymethane sulfinic acid. Circuit boards thus treated lend themselves well to electrodeposition.

Example 8

Process cycle corresponding to Example 5.

A 5 cm × 5 cm board made of FR4 material clad with copper on one side is used as a test board. After electrodeposition of copper for 10 min at 2 amp/dm$^2$, the plate is coated with copper on the side not copper-clad from the edge to approx. 1 cm.

Example 9

This example serves to compare the process according to the invention with known processes based on a palladium/tin catalyst. For this, a process according to Example 8 is used. Only in step 4 the catalyst is replaced by a commercially available hydrochloric acid palladium/tin catalyst (Noviganth Activator AK I*, 250 mg/l palladium, 10 min., 25° C.) and in step 5 the postdipping solution is replaced by a 2% tetrafluoroboric acid solution (5 min., RT). After the same 10 min. at 2 amp/dm$^2$, the test plate is coated with copper only a few millimeters on the edges.

In all process examples, the solutions are aqueous solutions of the contents listed. The concentrations of the components employed may often be exceeded or reduced by a factor of two to five without noticeable effects on the results of the through contacts. The same is true for the treatment times reported. Temperatures can frequently be varied by 10° to 20° C. without great impact on the results of the process.

Increased temperatures during processing of the circuit boards with the metal colloid improves the electroplatability. A temperature in the range from about 50° C. to about 80° C. has proved to be an advantageous. However, the process according to the invention can be performed at all temperatures slightly above the freezing point and slightly below the boiling point of the solvent used.

It will be apparent to those skilled in the art that various modifications and variations can be made regarding the process for applying a metal coating to a non-conductive substrate without using an electroless coating as well as the novel composition of the present invention without departing from the spirit or scope of the invention. It is intended that the present invention cover these modifications and variations, provided that they come within the scope of the appended claims and their equivalents.

What is claimed is:

1. A process for applying a principal metal coating to a non-conductive substrate without employing an electroless coating comprising:
   (a) contacting said substrate with a suspension comprising a noble metal colloid suspended in a polymer matrix to obtain a coated substrate;
   (b) removing at least part or substantially all of said polymer matrix from said coated substrate with a solution of a chalcogen that does not form chalcogenides of the noble metal;
   (c) electrolytically coating said substrate obtained after step (b) with a solution of said principal metal coating to obtain said substrate coated with said principal metal coating.

2. The process of claim 1 wherein said polymer matrix is selected to combine with the metal of said principal metal coating or said noble metal.

3. The process of claim 2 where a sufficient amount of said polymer matrix is removed to leave a residue of said polymer matrix, said residue being selected to combine with said principal metal, said principal metal having an outer surface, and said outer surface of said principal metal coating is substantially free of said polymer matrix.

4. The process of claim 1 wherein prior to contacting said substrate with said suspension comprising a noble metal colloid suspended in a polymer matrix, said substrate is contacted with a conditioner, said conditioner being selected to combine with said noble metal or said principal metal to obtain a conditioned substrate and said conditioned substrate is contacted with said suspension comprising a noble metal colloid suspended in a polymer matrix.

5. The process of claim 4 wherein said conditioner is a nitrogen-containing chelating agent or a nitrogen-containing cationic surface active substance or mixtures thereof.

6. The process of claim 4 wherein said noble metal colloid is a Group VIII noble metal, silver, gold, alloys thereof or mixtures thereof.

7. The process of claim 6 wherein said polymer matrix is an ionic or nonionic, soluble organic polymer.

8. The process of claim 7 wherein said polymer matrix is removed from said coated substrate by the solution of the chalcogen which is in an oxidation Ox state wherein $0 < Ox < 6$.

9. The process of claim 1 wherein said noble metal colloid in said suspension is combined with a reducing agent to counteract any oxidation of said noble metal colloid.

10. The process of claim 4 which further comprises applying a reducing agent to at least one of said substrate or said conditioned substrate.

11. The process of claim 9 which further comprises applying said reducing agent to at least one of said substrate or said conditioned substrate.

12. The process of claim 1 wherein said suspension of a noble metal colloid suspended in a polymer matrix is maintained under reducing conditions, the electrochemical potential of said suspension being from about $-170$ Mv to $-300$ Mv vs. Ag/AgCl.

13. The process as in any of claims 1 to 9 wherein the particle size of said noble metal is from about 100Å to about 1,000Å.

14. The process of claim 13 wherein said substrate is a multilayer board optionally containing through holes.

15. The process as in any one of claims 1 to 9 wherein said principal metal is a Group IB, IIB or VIII metal or alloys thereof.

* * * * *

UNITED STATES PATENT AND TRADEMARK OFFICE
CERTIFICATE OF CORRECTION

PATENT NO. : 5,421,989

DATED : JUNE 6, 1995

INVENTOR(S) : STAMP et al.

It is certified that error appears in the above-indentified patent and that said Letters Patent is hereby corrected as shown below:

Column 7, line 53, after "chalcogen" insert --compound--;

Column 7, line 55 change "chalcogens" to --chalcogen compounds--.

Claim 1, Col. 16, line 65, after "chalcogen" insert --compound--.

Claim 8, Col. 18, line 5, after "Chalcogen" insert ---compound---

Signed and Sealed this

Tenth Day of October, 1995

*Attest:*

BRUCE LEHMAN

*Attesting Officer*     *Commissioner of Patents and Trademarks*